United States Patent
Yang et al.

(10) Patent No.: US 11,128,333 B2
(45) Date of Patent: *Sep. 21, 2021

(54) SIGNAL RECEIVING CIRCUIT, SIGNAL PROCESSING CHIP, COMMUNICATIONS DEVICE, AND SIGNAL RECEIVING METHOD

(71) Applicant: HUAWEI TECHNOLOGIES CO., LTD., Guangdong (CN)

(72) Inventors: Kaituo Yang, Singapore (SG); Xiang Yi, Singapore (SG); Chirn Chye Boon, Singapore (SG); Junping Zhang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/911,868

(22) Filed: Jun. 25, 2020

(65) Prior Publication Data
US 2020/0328769 A1  Oct. 15, 2020

Related U.S. Application Data

(63) Continuation of application No. PCT/CN2018/123414, filed on Dec. 25, 2018.

(30) Foreign Application Priority Data

Dec. 26, 2017  (CN) .......................... 201711428778.2

(51) Int. Cl.
*H04B 1/18* (2006.01)
*H03F 3/189* (2006.01)
*H04B 1/16* (2006.01)

(52) U.S. Cl.
CPC .............. *H04B 1/18* (2013.01); *H03F 3/189* (2013.01); *H04B 1/1638* (2013.01); *H03F 2200/451* (2013.01)

(58) Field of Classification Search
CPC ........ H04B 1/69; H04B 1/707; H04B 1/1036; H04B 1/709; H04B 2201/70715;
(Continued)

(56) References Cited

U.S. PATENT DOCUMENTS 5,930,689 A * 7/1999 Wilhite .................. H03D 7/165
455/126
9,059,796 B2  6/2015 Murphy et al.
(Continued)

FOREIGN PATENT DOCUMENTS

CN  102075488 A  5/2011
CN  102096079 A  6/2011
(Continued)

OTHER PUBLICATIONS

Xin He et al., "A 45nm Low-Power SAW-less WCDMA Transmit Modulator Using Direct Quadrature Voltage Modulation", 2009 IEEE International Solid-State Circuits Conference, total 3 pages.
(Continued)

*Primary Examiner* — Ajibola A Akinyemi

(57) ABSTRACT

A signal receiving circuit amplifies a radio frequency signal by using a first radio frequency amplifier, outputs a first amplified signal in a same phase, amplifies the radio frequency signal by using a second radio frequency amplifier, and outputs a second amplified signal at an inverse phase. A first mixer mixes a first local oscillator signal with the first amplified signal to obtain a first frequency mixing signal, and a second mixer mixes a second local oscillator signal with the second amplified signal to obtain a second frequency mixing signal, where a phase of the first local oscillator signal is opposite to a phase of the second local oscillator signal. After adding the first frequency mixing signal and the second frequency mixing signal, an output
(Continued)

interface outputs the first frequency mixing signal and the second frequency mixing signal.

17 Claims, 7 Drawing Sheets

(58) Field of Classification Search
CPC ............ H04B 2201/70716; H04B 7/04; H04B 7/18504; H04B 7/2628; H04B 7/024; H04B 7/026
USPC ...................................................... 455/193.1
See application file for complete search history.

(56) References Cited

U.S. PATENT DOCUMENTS

| | | | |
|---|---|---|---|
| 2008/0169877 A1* | 7/2008 | Banba | ..................... H03F 1/565 |
| | | | 330/306 |
| 2014/0226748 A1 | 8/2014 | Dorosenco | |
| 2014/0355728 A1 | 12/2014 | Liao et al. | |
| 2016/0043822 A1* | 2/2016 | Yi | ........................ H04B 1/0057 |
| | | | 370/329 |

FOREIGN PATENT DOCUMENTS

| | | |
|---|---|---|
| CN | 104052407 A | 9/2014 |
| CN | 104218960 A | 12/2014 |
| CN | 104779917 A | 7/2015 |
| CN | 104821792 A | 8/2015 |
| CN | 105493410 A | 4/2016 |
| CN | 106612105 A | 5/2017 |
| CN | 206698207 U | 12/2017 |

OTHER PUBLICATIONS

David Murphy et al., "A Blocker-Tolerant, Noise-Cancelling Receiver Suitable for Wideband Wireless Applications", IEEE Journal of Solid-State Circuits, vol. 47, No. 12, pp. 2943-2963, Dec. 12, 2012.
H. Hedayati et al., "A 1.8 dB NF Blocker-Filtering Noise-Canceling Wideband Receiver with Shared TIA in 40 nm CMOS", IEEE Journal of Solid-State Circuits, vol. 50, No. 5, pp. 1148-1164, May 5, 2015.
Notice of Allowance issued in CN Application No. 2017114287782, dated Nov. 30, 2020, total 4 pages.

* cited by examiner

SIGNAL RECEIVING CIRCUIT, SIGNAL PROCESSING CHIP, COMMUNICATIONS DEVICE, AND SIGNAL RECEIVING METHOD

CROSS-REFERENCE TO RELATED APPLICATIONS

This application is a continuation of International Application No. PCT/CN2018/123414, filed on Dec. 25, 2018, which claims priority to Chinese Patent Application No. 201711428778.2, filed on Dec. 26, 2017. The disclosures of the aforementioned applications are hereby incorporated by reference in their entireties.

TECHNICAL FIELD

This application relates to the field of wireless communications technologies, and in particular, to a signal receiving circuit, a signal processing chip, a communications device, and a signal receiving method.

BACKGROUND

For most wireless communications systems, useful communication signals of the system are always accompanied by various noise signals, and a noise blocking signal (Blocker) is one of these signals. To ensure normal operation of the wireless communications system, a noise blocking signal needs to be strictly filtered.

The noise blocking signal is classified into an in-band blocking signal and an out-of-band blocking signal. In a related technology, the in-band blocking signal may be eliminated by using baseband filtering, and for the out-of-band blocking signal, the out-of-band blocking signal is removed by using a surface acoustic wave (SAW) filter before a signal receiving circuit. Specifically, for example, FIG. 1 is a schematic diagram of a connection of a signal receiving component 100 in a related technology. The signal receiving component 100 includes an antenna unit 110, a surface acoustic wave filter 120, and a signal receiving circuit 130. The signal receiving circuit 130 includes a low-noise amplifier 130a and a mixer 130b. A signal f received by the antenna unit 110 includes a wanted signal and a blocking signal. After an out-of-band blocking signal is removed from the blocking signal by using the surface acoustic wave filter 120, the signal f enters the receiving circuit 130. The low-noise amplifier 130a and the mixer 130b in the receiving circuit 130 further eliminate an in-band blocking signal from the signal f.

Because an operating bandwidth of the surface acoustic wave filter is fixed, in the signal receiving component shown in FIG. 1, when the signal receiving circuit supports multi-mode multi-band, a plurality of surface acoustic wave filters need to be disposed. This reduces design flexibility of the signal receiving circuit. In addition, the surface acoustic wave filters also cause insertion loss and deteriorate noise performance.

SUMMARY

Embodiments of this application provide a signal receiving circuit, a signal processing chip, a communications device, and a signal receiving method, to improve noise performance of the signal receiving circuit.

According to a first aspect, a signal receiving circuit is provided, where the signal receiving circuit includes an input interface, a first radio frequency amplifier, a first mixer, a second radio frequency amplifier, a second mixer, and an output interface; an output end of the input interface is separately connected to an input end of the first radio frequency amplifier and an input end of the second radio frequency amplifier; an output end of the first radio frequency amplifier is connected to an input end of the first mixer, and an output end of the second radio frequency amplifier is connected to an input end of the second mixer; an input end of the output interface is separately connected to an output end of the first mixer and an output end of the second mixer; the first radio frequency amplifier is configured to amplify the radio frequency signal and output a first amplified signal, where a phase of the first amplified signal is the same as a phase of the radio frequency signal; and the second radio frequency amplifier is configured to amplify the radio frequency signal and output a second amplified signal, where a phase of the second amplified signal is opposite to the phase of the radio frequency signal; the first mixer is configured to mix a first local oscillator (LO) signal with the first amplified signal to obtain a first frequency mixing signal; and the second mixer is configured to mix a second local oscillator signal with the second amplified signal to obtain a second frequency mixing signal, where a phase of the first local oscillator signal is opposite to a phase of the second local oscillator signal; and the output interface is configured to add the first frequency mixing signal and the second frequency mixing signal for output.

In the foregoing solution, a received signal is separately processed by using two signal paths, so that a wanted signal in the received signal is amplified in-phase and mutually superposed and enhanced, and thermal noise of an amplifier tube in the first radio frequency amplifier is inversely amplified and mutually superposed and offset, to obtain a relatively low noise coefficient. In addition, the LO signal in the mixer is isolated by using a radio frequency amplifier before the mixer, so that strength of the LO signal leaking to the antenna unit is attenuated, so that a signal sent by the antenna unit meets the spectrum specification.

Optionally, the output interface includes a first baseband amplifier, a second baseband amplifier, and an adder; and an input end of the first baseband amplifier is connected to the output end of the first mixer, an input end of the second baseband amplifier is connected to the output end of the second mixer, and an output end of the first baseband amplifier and an output end of the second baseband amplifier are separately connected to an input end of the adder; the first baseband amplifier is configured to amplify the first frequency mixing signal to obtain a third amplified signal; the second baseband amplifier is configured to amplify the second frequency mixing signal to obtain a fourth amplified signal; and the adder is configured to superpose the third amplified signal and the fourth amplified signal to obtain an output signal of the signal receiving circuit.

Optionally, the first radio frequency amplifier is a common gate amplifier.

In the foregoing optional solution, signal amplification, backward isolation of the LO signal, and input matching of an entire circuit are implemented by using the common gate amplifier.

Optionally, the signal receiving circuit further includes a first feedback capacitor; and one end of the first feedback capacitor is connected to a gate electrode of the common gate amplifier, and the other end of the first feedback capacitor is connected to the output end of the second radio frequency amplifier.

In the foregoing optional solution, a feedback capacitor is added between the two signal paths, and a signal whose polarity is opposite to an input signal is coupled to the gate electrode by using the feedback capacitor, thereby reducing current consumption of a common gate amplifier stage.

Optionally, an input load and an output load of the common gate amplifier are resistors.

In the foregoing optional solution, receiving of a wideband signal is implemented by using a resistor load.

Optionally, an input load and an output load of the common gate amplifier are inductors.

In the foregoing optional solution, narrow band receiving is implemented by using an inductor load, and because an inductor load does not consume voltage, the signal receiving circuit can work normally under a relatively low internal operating voltage drive of a component.

Optionally, the common gate amplifier includes at least two stages of common gate tubes.

In the foregoing optional solution, reverse isolation of the LO signal is further increased by using the at least two stages of common gate tubes.

Optionally, the second radio frequency amplifier is a common source amplifier.

In the foregoing optional solution, signal amplification and phase inversion are implemented by using the common source amplifier.

Optionally, the first mixer and the second mixer are separately driven by four paths of carrier signals whose duty cycle is 25% and that do not overlap each other;

or the first mixer and the second mixer are separately driven by eight paths of carrier signals whose duty cycle is 12.5% and that do not overlap each other.

According to a second aspect, a signal processing chip is provided, where the chip includes the signal receiving circuit according to any one of the first aspect or the optional solutions of the first aspect.

According to a third aspect, a communications device is provided, where the communications device includes the signal receiving circuit according to any one of the first aspect or the optional solutions of the first aspect.

According to a fourth aspect, a communications device is provided, where the communications device includes the signal processing chip according to the second aspect.

According to a fourth aspect, a signal receiving method is provided, and is used for a signal receiving circuit that includes an input interface, a first radio frequency amplifier, a first mixer, a second radio frequency amplifier, a second mixer, and an output interface, where an output end of the input interface is separately connected to an input end of the first radio frequency amplifier and an input end of the second radio frequency amplifier; an output end of the first radio frequency amplifier is connected to an input end of the first mixer, and an output end of the second radio frequency amplifier is connected to an input end of the second mixer; and an input end of the output interface is separately connected to an output end of the first baseband amplifier and an output end of the second baseband amplifier; and the method includes:

amplifying the radio frequency signal and outputting a first amplified signal by using the first radio frequency amplifier, where a phase of the first amplified signal is the same as a phase of the radio frequency signal; and amplifying the radio frequency signal and outputting a second amplified signal by using the second radio frequency amplifier, where a phase of the second amplified signal is opposite to the phase of the radio frequency signal;

mixing a first local oscillator signal with the first amplified signal by using the first mixer to obtain a first frequency mixing signal; and mixing a second local oscillator signal with the second amplified signal by using the second mixer to obtain a second frequency mixing signal, where a phase of the first local oscillator signal is opposite to a phase of the second local oscillator signal; and adding the first frequency mixing signal and the second frequency mixing signal by using the output interface for output.

Optionally, the output interface includes a first baseband amplifier, a second baseband amplifier, and an adder; an input end of the first baseband amplifier is connected to an output end of the first mixer, an input end of the second baseband amplifier is connected to an output end of the second mixer, and the output end of the first baseband amplifier and the output end of the second baseband amplifier are separately connected to an input end of the adder; and the adding the first frequency mixing signal and the second frequency mixing signal by using the output interface for output includes:

amplifying the first frequency mixing signal by using the first baseband amplifier to obtain a third amplified signal;

amplifying the second frequency mixing signal by using the second baseband amplifier to obtain a fourth amplified signal; and superposing the third amplified signal and the fourth amplified signal by using the adder to obtain an output signal of the signal receiving circuit.

DESCRIPTION OF EMBODIMENTS

To make the objectives, technical solutions, and advantages of this application clearer, the following further describes the implementations of this application in detail with reference to the accompanying drawings.

In a wireless communications system, a function of a signal receiving circuit is to obtain a required predetermined frequency signal from a signal received by an antenna unit, and filter out other frequency signals that are not needed. When each of the other frequency signals that are not needed by the signal receiving circuit has a greater signal strength than that of a signal that is needed by the signal receiving circuit, these other frequency signals that are not needed are referred to as "blocking signals". A filter configured to filter a blocking signal need to operate within its linear area to avoid distortion.

Figure 1:
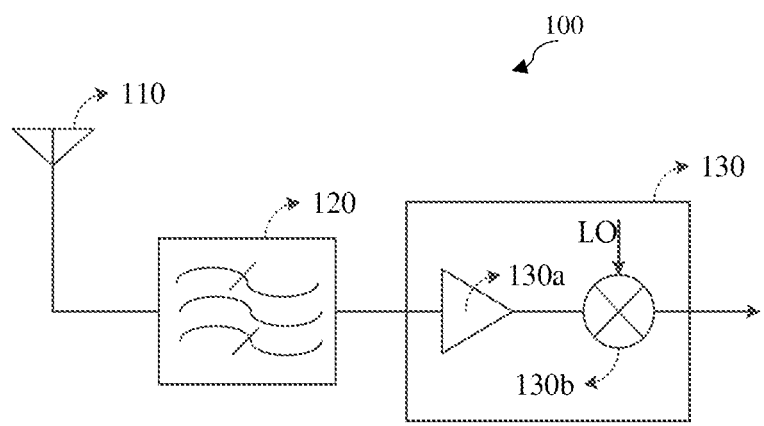
FIG. 1 is a schematic diagram of a signal receiving component in a related technology.
Figure 2:
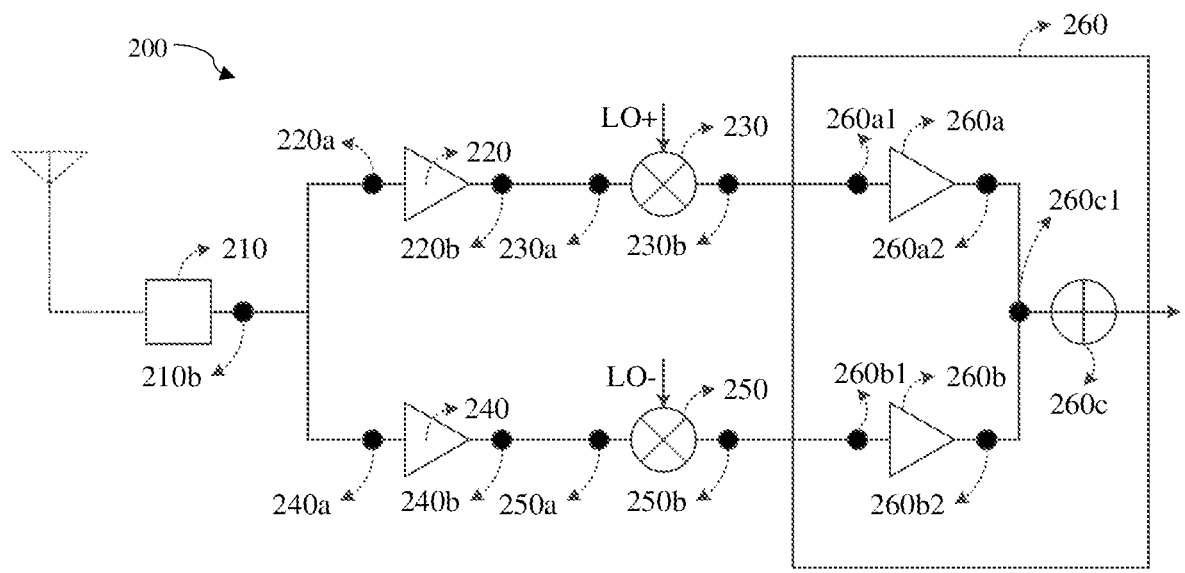
FIG. 2 is a schematic diagram of a signal receiving circuit according to an example embodiment of this application.

FIG. 2 is a schematic diagram of a signal receiving circuit 200 according to an example embodiment of this application. The signal receiving circuit 200 includes an input interface 210, a first radio frequency amplifier 220, a first mixer 230, a second radio frequency amplifier 240, a second mixer 250, and an output interface 260.

An output end 210b of the input interface 210 is separately connected to an input end 220a of the first radio frequency amplifier 220 and an input end 240a of the second radio frequency amplifier 240.

An output end 220b of the first radio frequency amplifier 220 is connected to an input end 230a of the first mixer 230, and an output end 240b of the second radio frequency amplifier 240 is connected to an input end 250a of the second mixer 250.

An input end 260a1 and an input end 260b1 of the output interface 260 are respectively connected to an output end 230b of the first mixer 230 and an output end 250b of the second mixer 250.

The first radio frequency amplifier 220 is configured to amplify the radio frequency signal and output a first amplified signal, where a phase of the first amplified signal is the same as a phase of the radio frequency signal. The second radio frequency amplifier 240 is configured to amplify the radio frequency signal and output a second amplified signal, where a phase of the second amplified signal is opposite to the phase of the radio frequency signal.

The first mixer 230 is configured to mix a first local oscillator signal with the first amplified signal to obtain a first frequency mixing signal. The second mixer 250 is configured to mix a second local oscillator signal with the second amplified signal to obtain a second frequency mixing signal. A phase of the first local oscillator signal is opposite to a phase of the second local oscillator signal.

The output interface 260 is configured to add the first frequency mixing signal and the second frequency mixing signal for output.

Optionally, the output interface 260 includes a first baseband amplifier 260a, a second baseband amplifier 260b, and an adder 260c.

An input end 260a1 of the first baseband amplifier 260a is connected to the output end 230b of the first mixer 230, an input end 260b1 of the second baseband amplifier 260b is connected to the output end 250b of the second mixer 250, and an output end 260a2 of the first baseband amplifier 260a and an output end 260b2 of the second baseband amplifier 260b are separately connected to an input end 260c1 of the adder 260c.

The first baseband amplifier 260a is configured to amplify the first frequency mixing signal to obtain a third amplified signal.

The second baseband amplifier 260b is configured to amplify the second frequency mixing signal to obtain a fourth amplified signal.

The adder 260c is configured to superpose the third amplified signal and the fourth amplified signal to obtain an output signal of the signal receiving circuit 200.

In the signal receiving circuit 200 shown in FIG. 2, an input end of the input interface 210 may be connected to an antenna unit, and an output end of the output interface 260 may be connected to a subsequent signal processing circuit, such as a demodulation circuit.

As shown in FIG. 2, the signal receiving circuit provided in this embodiment of this application is formed by two signal paths connected in parallel, a first signal path is formed by cascading the first radio frequency amplifier, the first mixer, and the first baseband amplifier, and the second signal path is formed by cascading the second radio frequency amplifier, the second mixer, and the second baseband amplifier. After a signal in the first signal path and a signal in the second signal path are amplified by the radio frequency amplifier, phases of wanted signals are opposite, in other words, a phase difference is 180 degrees, and phases of LO signals of the mixer in the first signal path and the second signal path are also opposite, in other words, a phase difference is 180 degrees. Therefore, for the wanted signals in the two signal paths, signal phases obtained after down-conversion are the same, and signals in a same phase are superposed together after passing through the adder to enhance each other. For thermal noise in the first radio frequency amplifier, signal phases obtained after down-conversion are opposite, and signals in an opposite phase are superimposed after passing through the adder, to reduce impact of noise and to obtain a relatively low noise coefficient.

In addition, a function of the first radio frequency amplifier and the second radio frequency amplifier can provide a reverse isolation capability. Therefore, signal strength of an LO signal in the first mixer and the second mixer that is leaked to an input interface of the signal receiving circuit by using the first radio frequency amplifier and the second radio frequency amplifier is greatly attenuated. Therefore, signal strength of the signal that is leaked to an antenna unit connected to the input interface of the signal receiving circuit is greatly reduced, and a signal sent by the antenna unit does not exceed a requirement of a spectrum specification.

In conclusion, the signal receiving circuit shown in this embodiment of this application separately processes a received signal by using two signal paths, so that a wanted signal in the received signal is amplified in-phase and mutually superposed and enhanced, and thermal noise of an amplifier tube in the first radio frequency amplifier is inversely amplified and mutually superposed and offset, to obtain a relatively low noise coefficient. In addition, the LO signal in the mixer is isolated by using a radio frequency amplifier before the mixer. Therefore, strength of the LO signal leaking to the antenna unit is attenuated, and a signal sent by the antenna unit meets the spectrum specification.

In this embodiment of this application, the first radio frequency amplifier may be implemented by using a common gate amplifier, and the second radio frequency amplifier may be implemented by using a common source amplifier.

Figure 3:
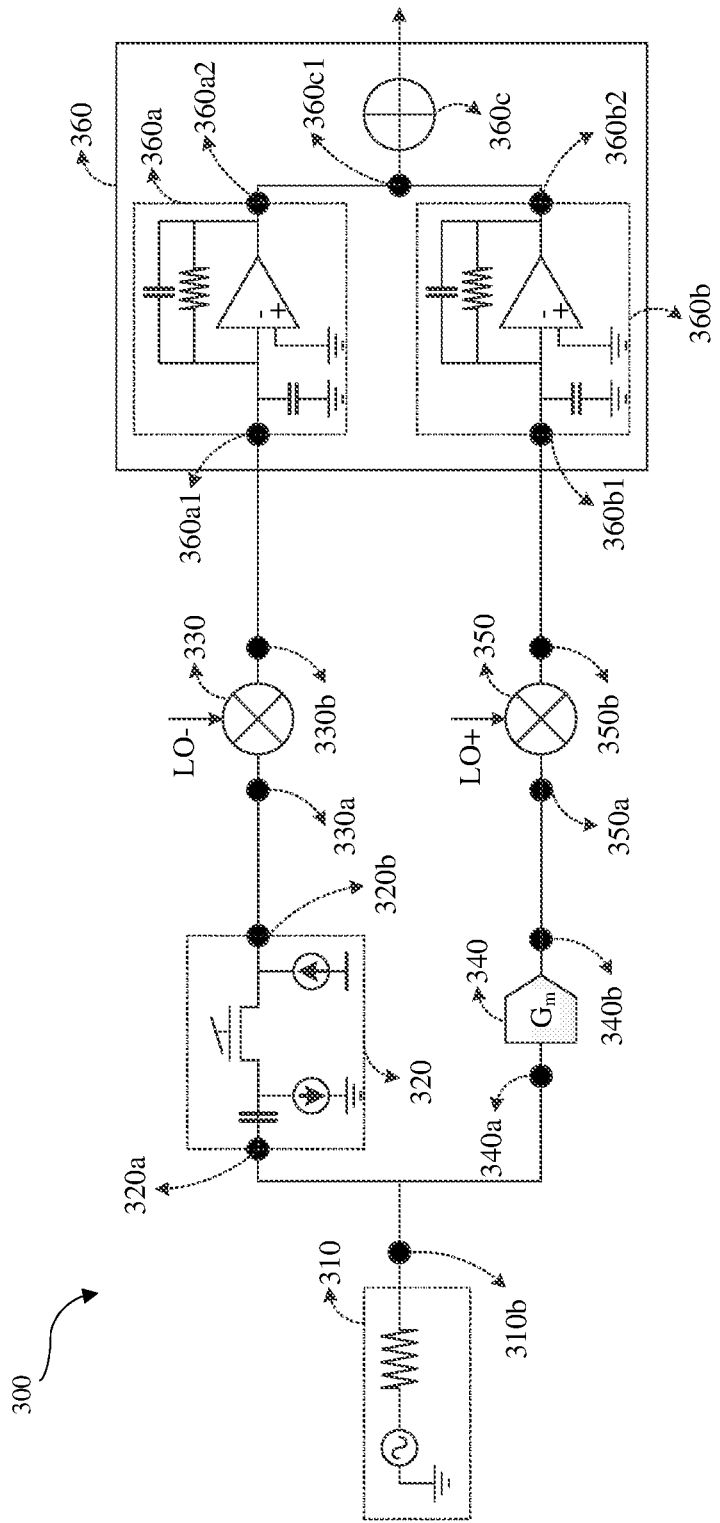
FIG. 3 is a schematic diagram of a signal receiving circuit according to an example embodiment of this application.

FIG. 3 is a schematic diagram of a signal receiving circuit 300 according to an example embodiment of this application. The signal receiving circuit 300 includes an input interface 310, a common gate amplifier 320, a first mixer 330, a common source amplifier 340, a second mixer 350, and an output interface 360.

An output end 310*b* of the input interface 310 is separately connected to an input end 320*a* of the common gate amplifier 320 and an input end 340*a* of the common source amplifier 340.

An output end 320*b* of the common gate amplifier 320 is connected to an input end 330*a* of the first mixer 330, and an output end 340*b* of the common source amplifier 340 is connected to an input end 350*a* of the second mixer 350.

An input end 360*a*1 and an input end 360*b*1 of the output interface 360 are respectively connected to an output end 330*b* of the first mixer 330 and an output end 350*b* of the second mixer 350.

The common gate amplifier 320 is configured to amplify the radio frequency signal and output a first amplified signal, where a phase of the first amplified signal is the same as a phase of the radio frequency signal. The common source amplifier 340 is configured to amplify the radio frequency signal and output a second amplified signal, where a phase of the second amplified signal is opposite to the phase of the radio frequency signal.

The first mixer 330 is configured to mix a first local oscillator (LO) signal with the first amplified signal to obtain a first frequency mixing signal. The second mixer 350 is configured to mix a second local oscillator signal with the second amplified signal to obtain a second frequency mixing signal. A phase of the first local oscillator signal is opposite to a phase of the second local oscillator signal.

The output interface 360 is configured to add the first frequency mixing signal and the second frequency mixing signal for output.

Optionally, the output interface 360 includes a first baseband amplifier 360*a*, a second baseband amplifier 360*b*, and an adder 360*c*.

An input end 360*a*1 of the first baseband amplifier 360*a* is connected to the output end 330*b* of the first mixer 330, an input end 360*b*1 of the second baseband amplifier 360*b* is connected to the output end 350*b* of the second mixer 350, and an output end 360*a*2 of the first baseband amplifier 360*a* and an output end 360*b*2 of the second baseband amplifier 360*b* are separately connected to an input end 360*c*1 of the adder 360*c*.

The first baseband amplifier 360*a* is configured to amplify the first frequency mixing signal to obtain a third amplified signal.

The second baseband amplifier 360*b* is configured to amplify the second frequency mixing signal to obtain a fourth amplified signal.

The adder 360*c* is configured to superpose the third amplified signal and the fourth amplified signal to obtain an output signal of the signal receiving circuit.

As shown in FIG. 3, the signal receiving circuit provided in this embodiment of this application is formed by two signal paths connected in parallel. A first signal path is formed by cascading a common source (CS) radio frequency amplifier, a mixer and a baseband amplifier. The second signal path is formed by cascading a common gate (CG) amplifier, a mixer and a baseband amplifier. Output of the baseband amplifier in last two signal paths is added as an output signal of a receiving circuit system. LO phases of the first signal path and the second signal path are opposite, in other words, a difference is 180 degrees. The common gate amplifier in the second signal path completes input matching, in other words, S11 of the entire receiving circuit meets a common requirement (e.g., generally lower than −10 dB). The first signal path amplifies only a signal at an input end, and does not perform any input matching.

After a received signal is amplified by using a common source amplifier, a phase of the signal is reversed. After the received signal is amplified by using a common gate amplifier, the phase of the signal remains unchanged. However, because the LO phases of the first signal path and the second signal path are opposite to each other, and a frequency of a wanted signal is the same as that of an LO signal, signals obtained after down-conversion in the two signal paths have the same phase, and the signals that pass through a baseband adder (Adder) are superposed in the same phase to enhance each other. Thermal noise of a common gate tube in the common gate amplifier of the second signal path is also amplified by the common source amplifier in the first signal path and is subjected to a lower side frequency. However, noise signals in the two paths are superposed in a reverse direction, and are mutually eliminated, thereby reducing impact of noise to obtain a relatively low noise coefficient.

At the same time, there is an amplifier between a receive end and a passive mixer in the two signal paths. The common source amplifier is used in the first signal path and the common gate amplifier is used in the second signal path. Both of them provide certain reverse isolation, about 20 dB. In this way, if an LO carrier signal is leaked to an output end of a mixer, the signal to be transmitted to a radio frequency input end is attenuated by 20 dB, and strength of the LO carrier signal is greatly reduced. This can meet a spectrum specification.

Optionally, the first mixer 330 and the second mixer 350 are separately driven by four paths of carrier signals whose duty cycle is 25% and that do not overlap each other. Alternatively, the first mixer 330 and the second mixer 350 are separately driven by eight paths of carrier signals whose duty cycle is 12.5% and that do not overlap each other.

Figure 4:
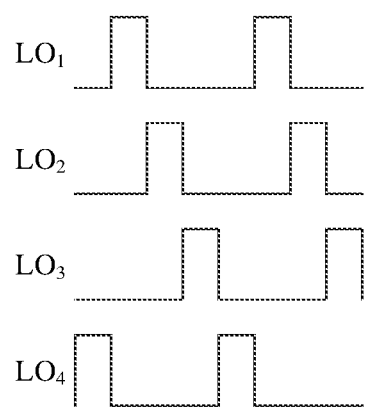
FIG. 4 is a schematic diagram of an example carrier of a passive mixer according to the embodiment shown in FIG. 3.

In the signal receiving circuit 300 shown in FIG. 3, the receiving circuit includes a primary signal path and an auxiliary signal path. The primary signal path includes a common gate amplifier, a passive mixer, and a trans-impedance amplifier (TIA). The TIA is the first baseband amplifier 360*a*. The auxiliary signal path includes a trans-conductance amplifier (namely, the common source amplifier), a passive mixer, and a trans-impedance amplifier (namely, the second baseband amplifier 360*b*). The passive mixers of the two paths form a multi-path filter (N-Path Filter), and the multi-path filter may be driven by four paths of carriers whose duty cycle is 25% and that do not overlap each other, or the four paths of carriers may be expanded to eight paths of carriers whose duty cycle is 12.5% or may be higher. The four paths of carriers whose duty cycle is 25% and that do not overlap each other are used as an example. FIG. 4 is a schematic diagram of a carrier of a passive mixer in this embodiment. Periods of the four paths of carriers are the same, a duty cycle of each path of carriers in each period is 25%, and each carrier does not overlap each other.

In the signal receiving circuit shown in this embodiment, an embedded N-path filter is used, and a relatively small input impedance of the TIA is migrated to a radio frequency end by using the passive mixer, in other words, an output end of the common gate amplifier and the common source amplifier, so that the two paths operate in an electric current mode, so that amplification of a wanted signal on a radio frequency port is avoided. In other words, a "load impedance of a next stage" of an LNA output end is relatively small, a signal flows into a lower stage in a form of an electric current, and is postponed to an output end of the TIA to complete amplification. In addition, amplification of a blocking signal at the radio frequency port is avoided. After being down-converted, the blocking signal is filtered through a TIA input capacitor and a feedback capacitor (an input capacitor is a capacitor grounded at one end of the TIA, and the feedback capacitor and a feedback resistor are connected in parallel to a TIA input/output end; and these capacitors together with the TIA form a low-pass filter, the blocking signal is filtered out because the blocking signal is out of a band, and the wanted signal is not filtered because the wanted signal is in the band). Therefore, strength of the blocking signal is greatly reduced, the circuit is not saturated, the entire receiving circuit has a high linearity, and can work when there is the blocking signal.

In addition, the primary signal path provides input matching, and the common gate amplifier also adds carrier signal isolation to an antenna, so that the carrier signal leaking to the antenna end is greatly reduced. This can meet a requirement of a spectrum specification and an actual communications system.

In addition, the signal receiving circuit also uses a noise cancellation technology, and thermal noise of a common gate tube can be eliminated by using an auxiliary path, so that the circuit achieves better noise performance while ensuring high linearity.

In conclusion, the signal receiving circuit shown in embodiments of this application separately processes a received signal by using two signal paths, so that a wanted signal in the received signal is amplified in-phase and mutually superposed and enhanced, and noise of a common gate amplified tube in the common gate amplifier of the primary signal path is inversely amplified and mutually superposed and offset, to obtain a relatively low noise coefficient. In addition, the LO signal in the mixer is isolated by using a radio frequency amplifier before the mixer, so that strength of the LO signal leaking to the antenna unit is attenuated, and a signal sent by the antenna unit meets the spectrum specification.

Figure 5:
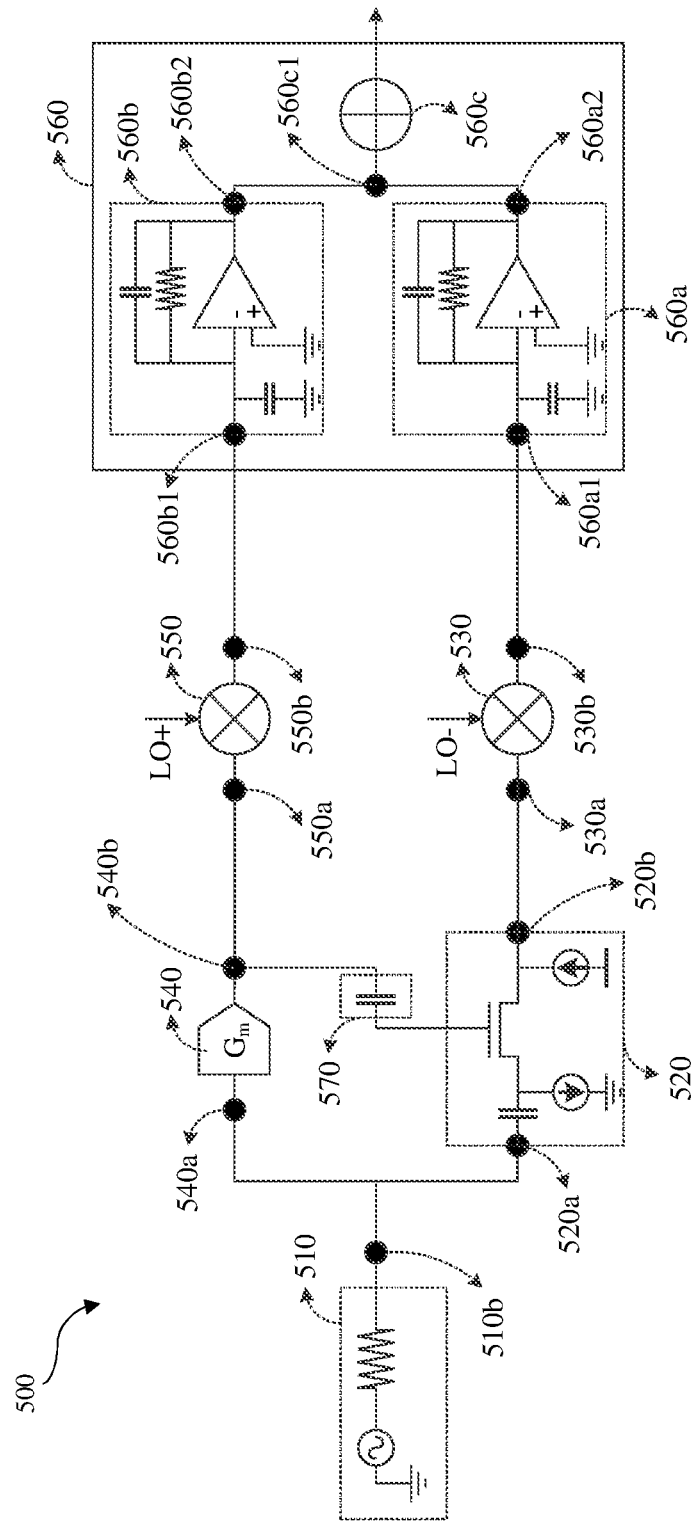
FIG. 5 is a schematic diagram of a signal receiving circuit according to an example embodiment of this application.

FIG. 5 is a schematic diagram of a signal receiving circuit 500 according to an example embodiment of this application. The signal receiving circuit 500 includes an input interface 510, a common gate amplifier 520, a first mixer 530, a common source amplifier 540, a second mixer 550, and an output interface 560.

An output end 510b of the input interface 510 is separately connected to an input end 520a of the common gate amplifier 520 and an input end 540a of the common source amplifier 540.

An output end 520b of the common gate amplifier 520 is connected to an input end 530a of the first mixer 530, and an output end 540b of the common source amplifier 540 is connected to an input end 550a of the second mixer 550.

An input end 560a1 and an input end 560b1 of the output interface 560 are separately connected to an output end 530b of the first mixer 530 and an output end 550b of the second mixer 550.

The common gate amplifier 520 is configured to amplify the radio frequency signal and output a first amplified signal, where a phase of the first amplified signal is the same as a phase of the radio frequency signal. The common source amplifier 540 is configured to amplify the radio frequency signal and output a second amplified signal, where a phase of the second amplified signal is the same as a phase of the radio frequency signal.

The first mixer 530 is configured to mix a first local oscillator (LO) signal with the first amplified signal to obtain a first frequency mixing signal. The second mixer 550 is configured to mix a second local oscillator signal with the second amplified signal to obtain a second frequency mixing signal. A phase of the first local oscillator signal is opposite to a phase of the second local oscillator signal.

The output interface 560 is configured to add the first frequency mixing signal and the second frequency mixing signal for output.

Optionally, the output interface 560 includes a first baseband amplifier 560a, a second baseband amplifier 560b, and an adder 560c.

The input end 560a1 of the first baseband amplifier 560a is connected to the output end 530b of the first mixer 530, the input end 560b1 of the second baseband amplifier 560b is connected to the output end 550b of the second mixer 550, and an output end 560a2 of the first baseband amplifier 560a and an output end 560b2 of the second baseband amplifier 560b are separately connected to an input end 560c1 of the adder 560c.

The first baseband amplifier 560a is configured to amplify the first frequency mixing signal to obtain a third amplified signal.

The second baseband amplifier 560b is configured to amplify the second frequency mixing signal to obtain a fourth amplified signal.

The adder 560c is configured to superpose the third amplified signal and the fourth amplified signal to obtain an output signal of the signal receiving circuit.

Optionally, the first mixer 530 and the second mixer 550 are separately driven by four paths of carrier signals whose duty cycle is 25% and that do not overlap each other. Alternatively, the first mixer 530 and the second mixer 550 are separately driven by eight paths of carrier signals whose duty cycle is 12.5% and that do not overlap each other.

Optionally, the signal receiving circuit 500 further includes a first feedback capacitor 570. One end of the first feedback capacitor 570 is connected to a gate electrode of the common gate amplifier 520, and the other end of the first feedback capacitor 570 is connected to an output end of the second radio frequency amplifier (namely, the common source amplifier 540).

Compared with the foregoing signal receiving circuit shown in FIG. 3, in this embodiment, a feedback capacitor is added between a primary signal path and an auxiliary path. By using coupling capacitance, a signal whose polarity is opposite to an input signal is coupled to the gate electrode, an equivalent trans-conductance of a common gate tube is added, and current consumed by a common gate amplifier stage is reduced. In other words, it is equivalent to that a signal that has a specified gain but whose phase is reverse is coupled to the gate electrode, and therefore an equivalent trans-conductance is increased from a source perspective.

Optionally, an input load and an output load of the common gate amplifier are resistors.

Optionally, an input load and an output load of the common gate amplifier are inductors.

Optionally, the common gate amplifier includes at least two stages of common gate tubes.

Figure 6:
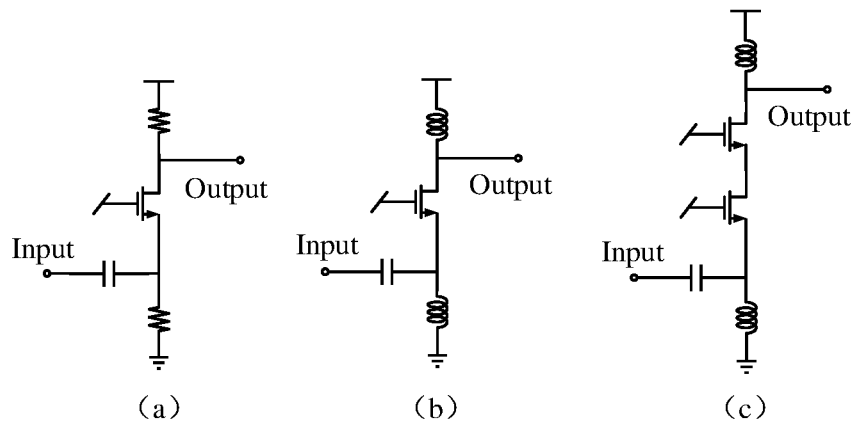
FIG. 6 illustrates schematic diagrams of non-limiting, example circuit of common gate amplifiers according to an embodiment of this application.

FIG. 6 shows schematic circuit diagrams of non-limiting, example common gate amplifiers shown in parts (a), (b) and (c) of the figure according to an embodiment of this application. For example, in FIG. 6, all input and output loads of a circuit of the example common gate amplifier in part (a) use a resistor, and all loads of a circuit of the example common gate amplifier in part (b) in FIG. 6 and all loads of a circuit of the example common gate amplifier in part (c) in FIG. 6 use an inductor. A resistive load can be wideband. Although an inductive load is a narrow band, it does not consume voltage. The resistive load can work normally under a relatively low internal operating voltage drive of a component. In FIG. 6, the circuit in part (c) has a one-stage common gate tube more than the circuit in part (b) in FIG. 6, so that reverse isolation of the circuit can be further increased. The circuit in part (c) in FIG. 6 is described by using an example in which the common gate amplifier includes two-stage common gate tubes connected in series, and an input/output load is an inductor. In embodiments of this application, a quantity of common gate tubes in the common gate amplifier may also be not limited to one or two common gate tubes, for example, may include three or more stages of common gate tubes. In addition, when the common gate amplifier includes two or more stages of common gate tubes, a resistor may also be used as an input/output load.

In the solution shown in this embodiment, an embedded N-path filter is used, and a relatively small input impedance of the TIA is migrated to a radio frequency end by using a passive mixer, in other words, an output end of the common gate amplifier and the common source amplifier, so that the two paths work in an electric current mode, amplification of a wanted signal at a radio frequency port is avoided, and the wanted signal is postponed to an output end of the TIA to complete amplification. In addition, amplification of a blocking signal at a radio frequency port is avoided. After being down-converted, the blocking signal is filtered by a TIA input capacitor and a feedback capacitor. Therefore, strength of the blocking signal is greatly reduced, the circuit is saturated, the entire receiving circuit has high linearity, and can work when there is the blocking signal.

In addition, the primary signal path in this embodiment provides input matching, and the common gate amplifier also adds carrier signal isolation to an antenna, so that the carrier signal leaking to the antenna end is greatly reduced. This can meet a requirement of a spectrum specification and an actual communications system.

In addition, the circuit in this embodiment also uses a noise cancellation technology, and thermal noise of a common gate tube can be eliminated by using an auxiliary path, so that the circuit achieves better noise performance while ensuring high linearity.

In addition, in this embodiment, a feedback capacitor is added between a primary signal path and an auxiliary path, and a signal whose polarity is opposite to an input signal is coupled to a gate electrode by using coupling capacitance to reduce current consumed by a common gate amplifier stage.

Figure 7:
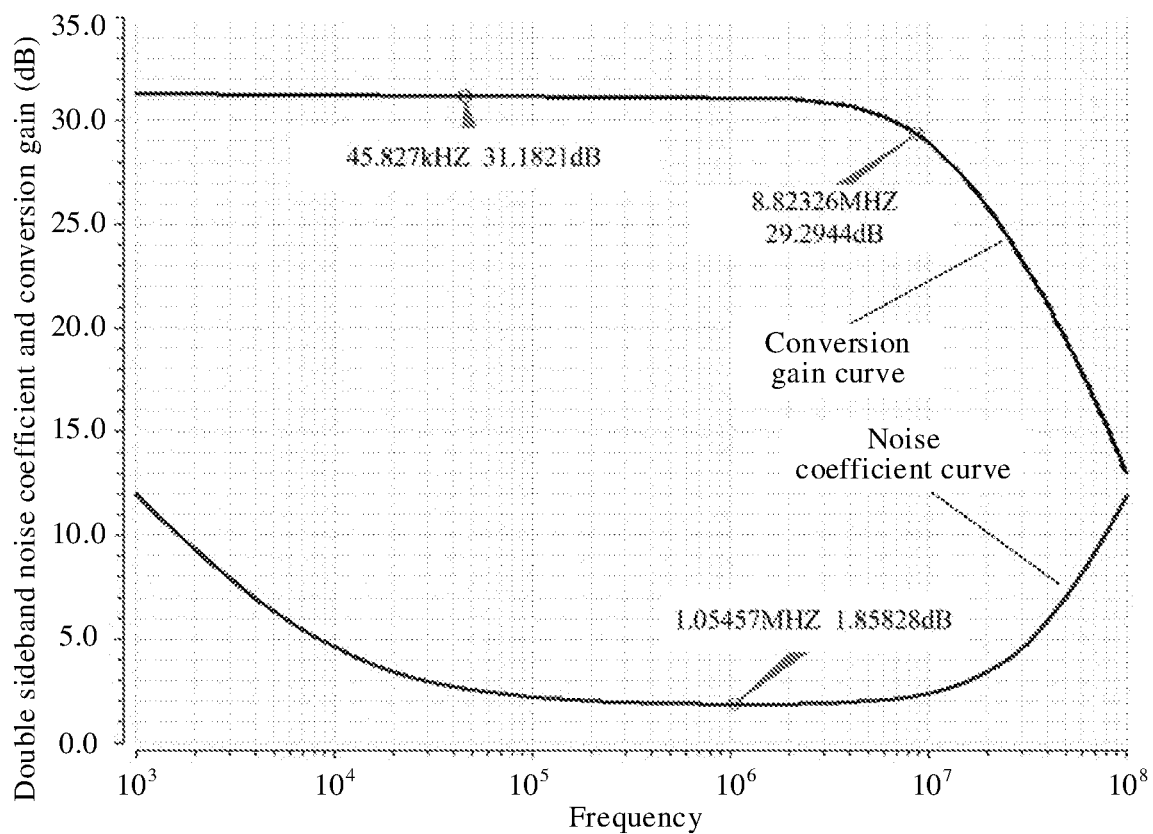
FIG. 7 is a non-limiting, example simulation result of a double sideband noise coefficient and a conversion gain in the embodiment shown in FIG. 5.

FIG. 7 shows a simulation result of a double sideband noise coefficient and a conversion gain according to an embodiment of this application. As shown in FIG. 7, the upper half curve is a conversion gain curve, and the lower half curve is a noise coefficient curve. In a signal receiving circuit whose bandwidth is 3 dB, by using the signal receiving circuit shown in this embodiment, a conversion gain of the entire signal receiving circuit may be greater than 30 dB, a noise coefficient is less than 2 dB, and a noise cancellation function is very obvious.

Figure 8:
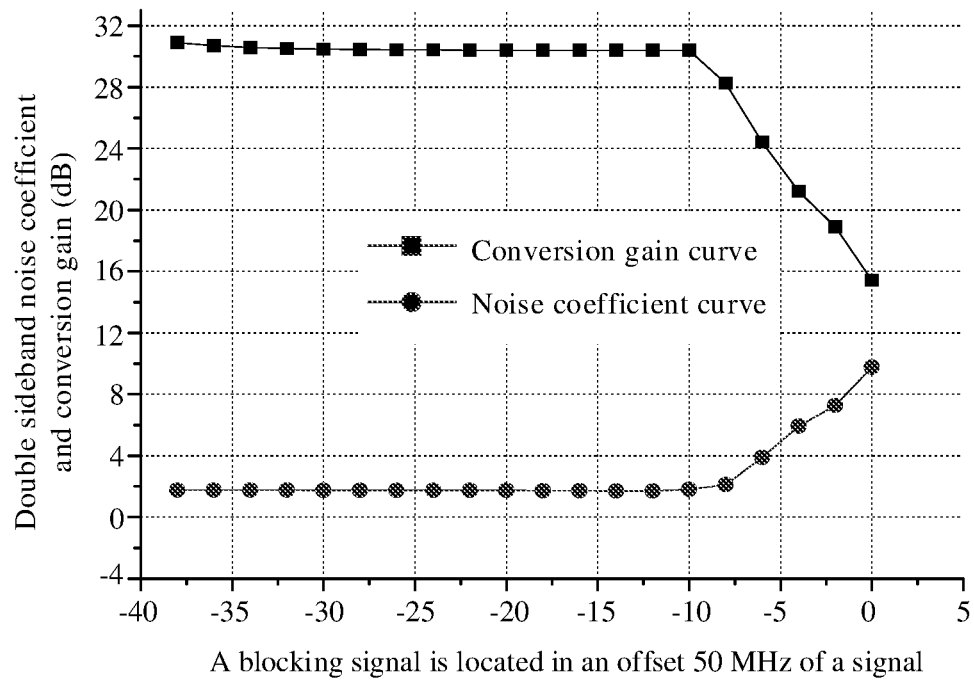
FIG. 8 is a non-limiting, example simulation result of a double sideband noise coefficient and a conversion gain in the embodiment shown in FIG. 5 when there is a blocking signal.

FIG. 8 shows a simulation result of a double sideband noise coefficient and a conversion gain when there is a blocking signal according to an embodiment of this application. As shown in FIG. 8, the upper half curve is a conversion gain curve, and the lower half curve is a noise coefficient curve. When the signal receiving circuit shown in this embodiment is used, the blocking signal is located at a 50 MHz offset of the signal. It may be learned from an observation simulation result that when strength of the blocking signal is greater than −10 dBm, the conversion gain starts to decrease, and a noise coefficient increases. When strength of the blocking signal is 0 dBm, the conversion gain is 15 dB. This is 16 dB lower than 31 dB when the strength of the blocking signal is very small. When strength of the blocking signal is 0 dBm, the noise coefficient is 10 dB. This is 8.2 dB higher than 1.8 dB when the strength of the blocking signal is very small.

In conclusion, the signal receiving circuit shown in this embodiment separately processes a received signal by using two signal paths, so that a wanted signal in the received signal is amplified in-phase and mutually superposed and enhanced, and thermal noise of a common gate tube in the common gate amplifier is inversely amplified and mutually superposed and offset, to obtain a relatively low noise coefficient. In addition, the LO signal in the mixer is isolated by using a radio frequency amplifier before the mixer, so that strength of the LO signal leaking to the antenna unit is attenuated, and a signal sent by the antenna unit meets the spectrum specification.

In addition, the signal receiving circuit in this embodiment adds a feedback capacitor between a primary signal path and an auxiliary path, and couples a signal whose polarity is opposite to an input signal to a gate electrode by using coupling capacitance to reduce current consumed by a common gate amplifier stage.

In embodiments of this application, the signal receiving circuit shown in FIG. 2, FIG. 3, or FIG. 5 may be implemented by using a chip. In other words, the signal receiving circuit shown in FIG. 2, FIG. 3, or FIG. 5 is included in a same signal processing chip.

Figure 9:
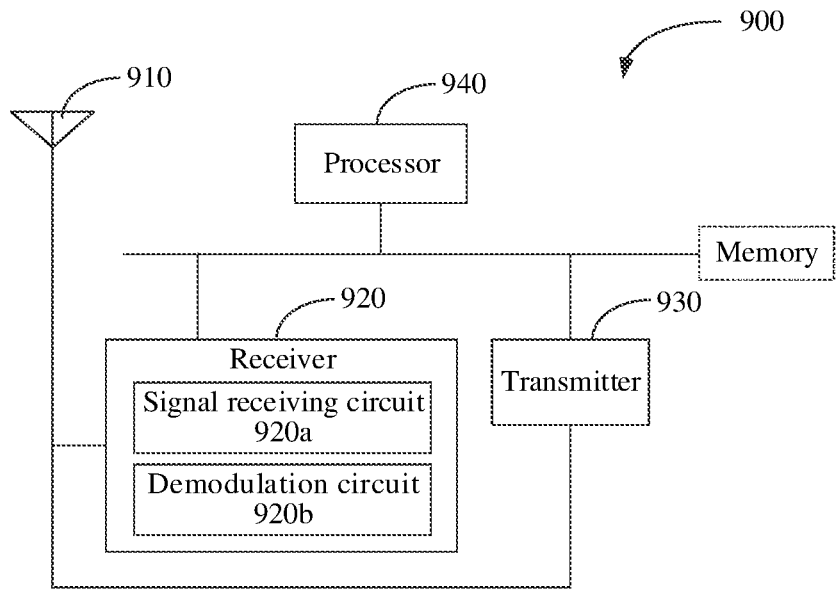
FIG. 9 is a schematic structural diagram of a communications device according to an embodiment of this application.

In a wireless communications system, a radio signal transceiver function of a communications device may be formed by using an antenna unit, a receiver, and a transmitter in the communications device. For example, FIG. 9 is a schematic structural diagram of a communications device 900 according to an embodiment of this application. As shown in FIG. 9, the communications device 900 includes an antenna unit 910, a receiver 920, a transmitter 930, and a processor 940.

The antenna unit 910 is separately connected to the receiver 920 and the transmitter 930, and the receiver 920 and the transmitter 930 are separately connected to the processor 940.

In this embodiment, the receiver 920 may include a signal receiving circuit 920a, and the signal receiving circuit 920a may be the signal receiving circuit shown in any one of FIG. 2, FIG. 3, or FIG. 5.

For example, in a possible implementation, the receiver 920 may be implemented based on a signal processing chip, and the signal processing chip may include the signal receiving circuit 920a and a demodulation circuit 920b.

The processor 940 may be a central processing unit (CPU), a network processor (NP), or the like.

Optionally, the communications device may further include a memory and a bus, and the receiver 920, the transmitter 930, the processor 940, and the memory may be connected by using the bus.

In another implementation, the memory may be configured to store a software program, various service data, user data, or the like.

It may be understood that FIG. 9 shows only a simplified design of a communications device. In embodiments of this application, the communications device may include any quantity of antenna units 910, receivers 920, transmitters 930, and processors 940.

Figure 10:
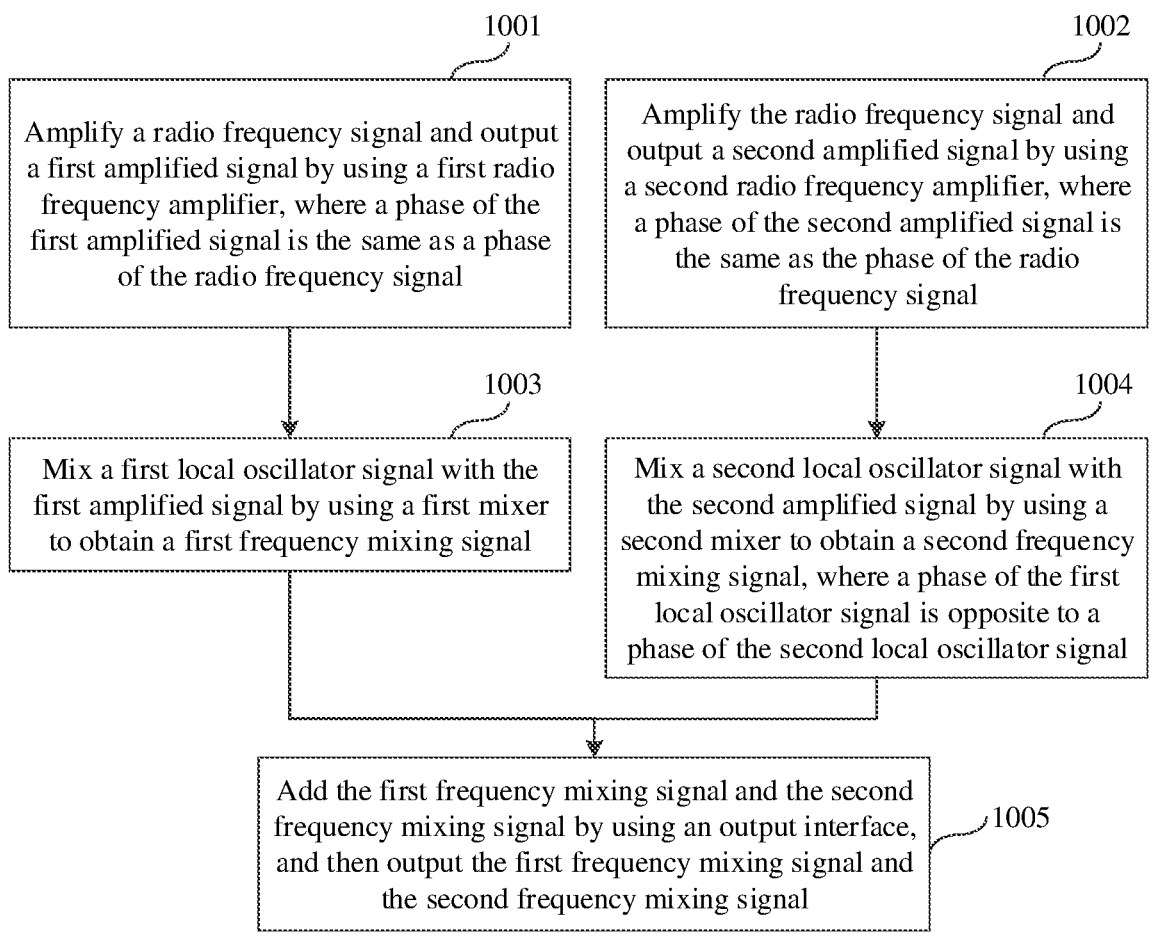
FIG. 10 is a flowchart of a signal receiving method according to an example embodiment of this application.

FIG. 10 is a method flowchart of a signal receiving method according to an example embodiment of this application. The signal receiving method may be implemented by a signal receiving circuit. The signal receiving circuit may include an input interface, a first radio frequency amplifier, a first mixer, a second radio frequency amplifier, a second mixer, and the signal receiving circuit of an output interface. An output end of the input interface is separately connected to an input end of the first radio frequency amplifier and an input end of the second radio frequency amplifier. An output end of the first radio frequency amplifier is connected to an input end of the first mixer. An output end of the second radio frequency amplifier is connected to an input end of the second mixer. An input end of the output interface is separately connected to an output end of the first baseband amplifier and an output end of the second baseband amplifier. As shown in FIG. 10, the signal receiving method may include the following steps.

Step 1001: Amplify a radio frequency signal and output a first amplified signal by using the first radio frequency amplifier, where a phase of the first amplified signal is the same as a phase of the radio frequency signal.

Step 1002: Amplify the radio frequency signal and output a second amplified signal by using the second radio frequency amplifier, where a phase of the second amplified signal is the same as a phase of the radio frequency signal.

Step 1003: Mix a first local oscillator signal with the first amplified signal by using the first mixer to obtain a first frequency mixing signal.

Step 1004: Mix a second local oscillator signal with a second amplified signal by using the second mixer to obtain a second frequency mixing signal, where a phase of the first local oscillator signal is opposite to a phase of the second local oscillator signal.

Step 1005: Add the first frequency mixing signal and the second frequency mixing signal by using the output interface, and then output the first frequency mixing signal and the second frequency mixing signal.

Optionally, the output interface includes a first baseband amplifier, a second baseband amplifier, and an adder; and an input end of the first baseband amplifier is connected to an output end of the first mixer, an input end of the second baseband amplifier is connected to an output end of the second mixer, and the output end of the first baseband amplifier and the output end of the second baseband amplifier are separately connected to an input end of the adder.

When the first frequency mixing signal and the second frequency mixing signal are added and output by using the output interface, the first frequency mixing signal may be amplified by using the first baseband amplifier to obtain a third amplified signal; the second frequency mixing signal is amplified by using the second baseband amplifier to obtain a fourth amplified signal; and the third amplified signal and the fourth amplified signal are superposed by using the adder to obtain an output signal of the signal receiving circuit.

Optionally, the first radio frequency amplifier is a common gate amplifier.

Optionally, the signal receiving circuit further includes a first feedback capacitor; and one end of the first feedback capacitor is connected to a gate electrode of the common gate amplifier, and the other end of the first feedback capacitor is connected to an output end of the second radio frequency amplifier.

Optionally, an input load and an output load of the common gate amplifier are resistors.

Optionally, an input load and an output load of the common gate amplifier are inductors.

Optionally, the common gate amplifier includes at least two stages of common gate tubes.

Optionally, the second radio frequency amplifier is a common source amplifier.

Optionally, the first mixer and the second mixer are separately driven by four paths of carrier signals whose duty cycle is 25% and that do not overlap each other; or the first mixer and the second mixer are separately driven by eight paths of carrier signals whose duty cycle is 12.5% and that do not overlap each other.

For a connection manner of each element in the signal receiving circuit and a specific implementation of the foregoing steps, refer to the foregoing descriptions in FIG. 2, FIG. 3, and FIG. 5. Details are not described herein again.

In conclusion, the signal receiving method shown in embodiments of this application separately processes a received signal by using two signal paths, so that a wanted signal in the received signal is amplified in-phase and mutually superposed and enhanced, and thermal noise of a common gate tube in the common gate amplifier is inversely amplified and mutually superposed and offset, to obtain a relatively low noise coefficient. In addition, the LO signal in the mixer is isolated by using a radio frequency amplifier before the mixer, so that strength of the LO signal leaking to the antenna unit is attenuated, and a signal sent by the antenna unit meets the spectrum specification.

In addition, the signal receiving method in embodiments of this application adds a feedback capacitor between a primary signal path and an auxiliary path, and couples a signal whose polarity is opposite to an input signal to a gate electrode by using coupling capacitance to reduce current consumed by a common gate amplifier stage.

Optionally, when the signal receiving circuit provided in the foregoing embodiment performs data forwarding, division of the foregoing functional units is merely used as an example for description. In embodiments of this application, the foregoing functions can be allocated according to a requirement to different functional modules, that is, an inner structure of the signal receiving circuit is divided into different functional units to implement all or some of the foregoing functions. In addition, the signal receiving circuit provided in the foregoing embodiments pertains to a same concept as the method embodiment of the signal receiving method embodiments. For a specific implementation process, refer to the method embodiments. Details are not described herein again.

The foregoing descriptions are merely example implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A signal receiving circuit, comprising an input interface, a first radio frequency amplifier, a first mixer, a second radio frequency amplifier, a second mixer, and an output interface, wherein
   an output end of the input interface is separately connected to an input end of the first radio frequency amplifier and an input end of the second radio frequency amplifier;
   an output end of the first radio frequency amplifier is connected to an input end of the first mixer, and an output end of the second radio frequency amplifier is connected to an input end of the second mixer;
   at least one input end of the output interface is separately connected to an output end of the first mixer and an output end of the second mixer;

the first radio frequency amplifier is configured to amplify a radio frequency signal and output a first amplified signal, wherein a phase of the first amplified signal is the same as a phase of the radio frequency signal, and the second radio frequency amplifier is configured to amplify the radio frequency signal and output a second amplified signal, wherein a phase of the second amplified signal is opposite to the phase of the radio frequency signal;

the first mixer is configured to mix a first local oscillator signal with the first amplified signal to obtain a first frequency mixing signal, and the second mixer is configured to mix a second local oscillator signal with the second amplified signal to obtain a second frequency mixing signal, wherein a phase of the first local oscillator signal is opposite to a phase of the second local oscillator signal; and the output interface is configured to add the first frequency mixing signal and the second frequency mixing signal for output.

2. The signal receiving circuit according to claim 1, wherein the output interface comprises a first baseband amplifier, a second baseband amplifier, and an adder, an input end of the first baseband amplifier being connected to the output end of the first mixer, an input end of the second baseband amplifier being connected to the output end of the second mixer, and an output end of the first baseband amplifier and an output end of the second baseband amplifier being separately connected to an input end of the adder, the first baseband amplifier being configured to amplify the first frequency mixing signal to obtain a third amplified signal, the second baseband amplifier being configured to amplify the second frequency mixing signal to obtain a fourth amplified signal, and the adder being configured to superpose the third amplified signal and the fourth amplified signal to obtain an output signal of the signal receiving circuit.

3. The signal receiving circuit according to claim 2, wherein the third amplified signal and the fourth amplified signal superposed by the adder are in a same phase.

4. The signal receiving circuit according to claim 2, wherein a first noise signal in the first radio frequency amplifier is mixed with the first local oscillator signal by the first mixer and amplified by the first baseband amplifier to output a first amplified noise signal, a second noise signal in the second radio frequency amplifier is mixed with the second local oscillator signal by the second mixer and amplified by the second baseband amplifier to output a second amplified noise signal, a phase difference between the first amplified noise signal and the second amplified noise signal is 180 degree, and the first amplified noise signal and the second amplified noise signal are superposed by the adder, thereby reducing impact of the first and second noise signals in the first and second radio frequency amplifier.

5. The signal receiving circuit according to claim 1, wherein the first radio frequency amplifier is a common gate amplifier.

6. The signal receiving circuit according to claim 5, wherein the signal receiving circuit further comprises a first feedback capacitor, one end of the first feedback capacitor being connected to a gate electrode of the common gate amplifier, and the other end of the first feedback capacitor being connected to the output end of the second radio frequency amplifier.

7. The signal receiving circuit according to claim 5, wherein an input load and an output load of the common gate amplifier are resistors.

8. The signal receiving circuit according to claim 5, wherein an input load and an output load of the common gate amplifier are inductors.

9. The signal receiving circuit according to claim 5, wherein the common gate amplifier comprises at least two stages of common gate tubes.

10. The signal receiving circuit according to claim 1, wherein the second radio frequency amplifier is a common source amplifier.

11. The signal receiving circuit according to claim 1, wherein the first mixer and the second mixer are separately driven by four paths of carrier signals, a duty cycle of each of the carrier signals is 25% and the carrier signals do not overlap each other; or the first mixer and the second mixer are separately driven by eight paths of carrier signals, a duty cycle of each of the carrier signals is 12.5% and the carrier signals do not overlap each other.

12. A signal processing chip comprising the signal receiving circuit according to claim 1.

13. A communications device comprising the signal receiving circuit according to claim 1.

14. A communications device comprising the signal processing chip according to claim 12.

15. The signal receiving circuit according to claim 1, wherein a phase difference between the first amplified signal and the second amplified signal is 180 degree.

16. A signal receiving method implemented by a signal receiving circuit including an input interface, a first radio frequency amplifier, a first mixer, a second radio frequency amplifier, a second mixer, and an output interface, wherein an output end of the input interface is separately connected to an input end of the first radio frequency amplifier and an input end of the second radio frequency amplifier; an output end of the first radio frequency amplifier is connected to an input end of the first mixer, and an output end of the second radio frequency amplifier is connected to an input end of the second mixer; and at least one input end of the output interface is separately connected to an output end of a first baseband amplifier and an output end of the second baseband amplifier, the method comprising:

amplifying a radio frequency signal and outputting a first amplified signal by using the first radio frequency amplifier, wherein a phase of the first amplified signal is the same as a phase of the radio frequency signal; and amplifying the radio frequency signal and outputting a second amplified signal by using the second radio frequency amplifier, wherein a phase of the second amplified signal is opposite to the phase of the radio frequency signal;

mixing a first local oscillator signal with the first amplified signal by using the first mixer to obtain a first frequency mixing signal, and mixing a second local oscillator signal with the second amplified signal by using the second mixer to obtain a second frequency mixing signal, wherein a phase of the first local oscillator signal is opposite to a phase of the second local oscillator signal; and adding the first frequency mixing signal and the second frequency mixing signal by using the output interface for output.

17. The method according to claim 16, wherein the output interface comprises a first baseband amplifier, a second baseband amplifier, and an adder, an input end of the first baseband amplifier is connected to an output end of the first mixer, an input end of the second baseband amplifier is connected to an output end of the second mixer, and the output end of the first baseband amplifier and the output end of the second baseband amplifier are separately connected to an input end of the adder; and adding the first frequency mixing signal and the second frequency mixing signal by using the output interface for output comprises:
amplifying the first frequency mixing signal by using the first baseband amplifier to obtain a third amplified signal,
amplifying the second frequency mixing signal by using the second baseband amplifier to obtain a fourth amplified signal, and
superposing the third amplified signal and the fourth amplified signal by using the adder to obtain an output signal of the signal receiving circuit.

* * * * *